United States Patent
Couet et al.

(10) Patent No.: US 11,737,371 B2
(45) Date of Patent: Aug. 22, 2023

(54) SPINTRONIC DEVICE

(71) Applicant: IMEC vzw, Leuven (BE)

(72) Inventors: Sebastien Couet, Grez-Doiceau (BE); Siddharth Rao, Leuven (BE); Robert Carpenter, Leuven (BE)

(73) Assignee: IMEC vzw, Leuven (BE)

( * ) Notice: Subject to any disclaimer, the term of this patent is extended or adjusted under 35 U.S.C. 154(b) by 178 days.

(21) Appl. No.: 17/079,264

(22) Filed: Oct. 23, 2020

(65) Prior Publication Data

US 2021/0126190 A1 Apr. 29, 2021

(30) Foreign Application Priority Data

Oct. 25, 2019 (EP) .................................... 19205332

(51) Int. Cl.
*H10N 50/80* (2023.01)
*H10B 61/00* (2023.01)
*H10N 50/85* (2023.01)

(52) U.S. Cl.
CPC ............. *H10N 50/80* (2023.02); *H10B 61/00* (2023.02); *H10N 50/85* (2023.02)

(58) Field of Classification Search
CPC ....... H01L 43/02; H01L 27/222; H01L 43/10; G11C 11/161; H10N 50/80; H10N 50/85; H10B 61/00
See application file for complete search history.

(56) References Cited

U.S. PATENT DOCUMENTS

| | | | |
|---|---|---|---|
| 7,663,848 B1 * | 2/2010 | Huai | H01F 10/3254 360/324.2 |
| 2008/0239589 A1 * | 10/2008 | Guo | B82Y 40/00 360/324.12 |
| 2011/0163400 A1 | 7/2011 | Ono | |
| 2013/0187248 A1 * | 7/2013 | Kariyada | G11C 11/161 257/425 |
| 2014/0145792 A1 | 5/2014 | Wang et al. | |
| 2017/0077387 A1 * | 3/2017 | Kan | H01F 41/307 |
| 2018/0261762 A1 | 9/2018 | Apalkov et al. | |

OTHER PUBLICATIONS

P. X. Zhang et al., Spin-orbit torque in a completely compensated synthetic antiferromagnet, Physical Review B 97, 214403 (2018) (Year: 2018).*
Extended European Search Report dated Apr. 21, 2020 in counterpart European Application No. 19205332.0 in 9 pages.

* cited by examiner

*Primary Examiner* — Shih Tsun A Chou
(74) *Attorney, Agent, or Firm* — Knobbe, Martens, Olson & Bear, LLP

(57) ABSTRACT

The disclosed technology relates generally to a magnetic device and more particularly to a spintronic device comprising a tunnel barrier, a hybrid storage layer on the tunnel barrier and a metal layer on the hybrid storage layer. The hybrid storage layer comprises a first magnetic layer, a spacer layer on the first magnetic layer and at least one further magnetic layer on the spacer layer and exchange coupled to the first magnetic layer via the spacer layer.

24 Claims, 3 Drawing Sheets

SPINTRONIC DEVICE

CROSS-REFERENCE TO RELATED APPLICATIONS

This application claims foreign priority to European Application No. EP 19205332.0, filed Oct. 25, 2019, the content of which is incorporated by reference herein in its entirety.

BACKGROUND

Field

The disclosed technology relates generally to magnetic memory and/or logic devices, and more particularly to a spintronic device.

Description of the Related Technology

In spintronic devices such as magnetic memory and/or logic devices, information may be stored in a magnetic structure sometimes referred to as the "storage layer" (also referred to as the "free layer," compared to another magnetic structure called the "fixed layer" or "reference layer"). Depending on the magnetization of the storage layer—with the fixed layer always having the same magnetization—the storage layer can be considered to store a "0" or "1.". In some technologies, the storage layer may be formed of CoFeB, or a similar material, and can incorporate a heavy metal layer such as Ta, W, etc., in order to increase its magnetic anisotropy. This can improve the retention characteristic of the storage layer, and thus of the magnetic device as a whole. However, the figure of merit of the storage layer includes not only the retention ($\Delta$)—which should be as high as possible—but also the switching current ($I_{SW}$)—which should be as low as possible. A storage layer with excellent figure of merit is obviously desired.

One way to reduce the switching current is to adopt a "double MTJ" design, where a second tunnel junction is grown on top of the free layer, and then a second fixed structure is grown on top. This second tunnel junction enables to add a second torque term during switching, hence reducing the required current while keeping $\Delta$ high. However, this design poses serious challenges since the stack becomes thicker, which may lead to problems when etching at tight pitch. Furthermore, the presence of a second high-quality MgO junction increases the resistance of the device while reducing tunnel magnetoresistance (TMR). Hence there is a clear trade off on performance. Thus, there is a need in the art for spintronic devices that are of small size but still only requires a low switching current.

SUMMARY OF CERTAIN INVENTIVE ASPECTS

It is an object of the invention to at least partly overcome one or more limitations of the prior art. In particular, it is an object to provide a spintronic device requiring low power but high retention ($\Delta$). The objective is achieved by the embodiments of the invention provided in the enclosed independent claims. Advantageous implementations of these embodiments are defined in the dependent claims.

In a first aspect of the disclosed technology, there is provided a spintronic device comprising a tunnel barrier;

a hybrid storage layer provided on the tunnel barrier, wherein the hybrid storage layer comprises a first magnetic layer;

a spacer layer provided on the first magnetic layer;

at least one further magnetic layer provided on the spacer layer and exchange coupled to the first magnetic layer via the spacer layer, and wherein the spintronic device further comprises a metal layer provided on the hybrid storage layer.

The hybrid storage layer may thus be designed so that it has two stable and distinct magnetic states that define a binary one ("1") and a binary zero ("0"). The hybrid storage layer comprises more than a single free layer.

Hybrid storage layer is a storage layer comprising more than one type of magnetic layer, such as a CoFeB layer and a Co layer. Thus, the at least one further magnetic layer me comprise or consist of a layer that is different from the first magnetic layer.

Thus, a hybrid storage layer allows for incorporating intrinsic perpendicular magnetic anisotropy (PMA) material such as Co or Co/Pt laminates, that can significantly boost the retention.

The first magnetic layer of the hybrid storage layer may be configured to provide the tunnel magnetoresistance (TMR) effect for device read, and the spin transfer torque (STT) effect for device write.

In embodiments of the first aspect, the first magnetic layer may be a CoFeB or FeB layer.

Furthermore, the thickness of the first magnetic layer may be in a range of 0.4-1.5 nm.

The spacer layer of the hybrid storage layer may be configured to provide a texture breaking between the different crystallographic orientations of the first magnetic layer and the second magnetic layer, respectively. As an example, the spacer layer may be a heavy-metal layer or a heavy-metal transition-metal alloy layer.

There is further at least one further magnetic layer provided on the spacer layer and exchange coupled (magnetic exchange interaction) to the first magnetic layer via the spacer layer. The at least one further magnetic layer may thus consist of a single further magnetic layer or include several further magnetic layers.

The metal layer provided on the hybrid storage layer may have at least some lattice compatibility with the uppermost further magnetic layer. As an example, if the uppermost further magnetic layer is a Co (111) layer, the metal layer may have a similar texture. As an example, the metal layer may be Ru (0001), Pt (111) or Cu (111). However, the metal layer may as an alternative have a predominantly amorphous structure, like that of thin Ta. Such an amorphous layer may be used since it does not create a frustration in the grain structure.

In the context of the present disclosure, a layer being "provided on" another layer may either mean that the layer is arranged "below" (for a top-pinned device) or "above" (for a bottom pinned device) the other layer. Thereby, the terms "below"/"above" or "bottom"/"top" relate to layers of the material stack, in particular to the fabrication/growth direction of these layers. In any case, "provided on" means that the layer is in contact with the other layer. For instance, the layer may be (epitaxially) grown on the other layer.

The first aspect of the invention is based on the insight that having a metal layer provided on the hybrid storage layer may enable more efficient switching than conventional designs. The metal layer may thus be the final critical layer of the stack and may thus on its own act as a spin sink. If the metal layer is used as the final critical layer, it would provide for easier offset field control, since no second magnet is present. However, there may be further magnetic layers provided on top of the metal layer, such as other fixed magnetic layers.

In embodiments of the first aspect, the metal layer is configured to decouple the hybrid storage layer from any fixed magnetic layer that is provided on top of said metal layer. This may provide for having additional magnetic layers provided on top of the metal layer, such that extra torque may be generated to the free layer.

The metal layer may have a high conductivity and a low spin-orbit interaction

In embodiments of the first aspect, the metal layer has a thickness that is above 1 nm. As an example, the metal layer may have a thickness of above 2 nm, such as between 3-10 nm. As another example, the metal layer may have a thickness range of 1-10 nm, such as a range of 1-4 nm.

In embodiments of the first aspect, the metal layer comprises a low spin-orbit interaction metal. As an example, such low spin-orbit interaction metal may be selected from silver (Ag), gold (Au), copper (Cu), chromium (Cr) and ruthenium (Ru).

In a preferred embodiment, the metal layer is Ru. The inventors have found that the use of Ru may be efficient to decouple the hybrid free layer from any further magnetic layers provided on top of the metal layer. Further, the use of Ru facilitates growing the metal layer and at the same time providing torque.

In another preferred embodiment, the metal layer is Cu, which may be used to provide a high torque factor.

Consequently, in embodiments of the first aspect, the metal layer comprises or consists of a metal selected from Ru and Cu.

The at least one further magnetic layer may be a single second magnetic layer. Consequently, in embodiments of the first aspect, the at least one further magnetic layer consists of a second magnetic layer.

The second magnetic layer may be a single Co-based layer. A "Co-based" second magnetic layer may be a Co layer. However, it can also be a layer based on or comprising Co, for instance, a CoNi, CoPt, or CoFe layer, or a laminate or an alloy thereof. As an example, the second magnetic layer may be a CoPtCr layer.

Furthermore, the first magnetic layer may have a first crystallographic orientation whereas the second magnetic layer may have a second crystallographic orientation. As an example, the first crystallographic orientation may be a (100) orientation, and/or the second crystallographic orientation may be a (111) orientation. Consequently, the first and second crystallographic orientations may be different.

Furthermore, the thickness of the second magnetic layer may be in a range of 0.4-1.5 nm.

The at least one further magnetic layer may also consist of a plurality of layers, such as at least two further magnetic layers separated by a spacer layer.

Thus, in embodiments of the first aspect, the at least one further magnetic layer comprises a second magnetic layer, an antiferromagnetic coupling layer provided on the second magnetic layer, and a third magnetic layer that is antiferromagnetically coupled to the second magnetic layer.

The second magnetic layer may also in this context be a Co-based layer, such as Co, CoNi, CoPt, or CoFe layer, or a laminate or an alloy thereof.

Further, also the third magnetic layer may be a Co-based layer, such as Co, CoNi, CoPt, or CoFe layer, or a laminate or an alloy thereof.

The antiferromagnetic coupling layer may, for example, be a Ru layer, an Ir layer, or a Rh layer. In particular, the antiferromagnetic coupling layer may be configured to provide an antiferromagnetic Ruderman-Kittel-Kasuya-Yosida (RKKY) coupling. The RKKY coupling generates an antiferromagnetic arrangement of spins in the second magnetic layer and spins in the third magnetic layer, respectively. The strength of this antiferromagnetic RKKY coupling is a function of the thickness of the antiferromagnetic coupling layer arranged between the second and third magnetic layer. For specific thicknesses of the antiferromagnetic coupling layer, the RKKY coupling strength shows peaks. Here, the Ru layer may particularly be a Ru (0.4, 0.8) layer and/or the Ir layer may particularly be an Ir (0.5, 0.9) layer. Thereby, "0.4" and "0.8" denote thicknesses of the Ru layer in nm, at which peaks appear in the antiferromagnetic RKKY coupling. Likewise, "0.5" and "0.9" denote thicknesses of the Jr layer in nm, at which such coupling peaks appear. In particular, the given thicknesses are related to the first peak and the second peak in the strength of the antiferromagnetic RKKY coupling, respectively. Preferably, the first peak or the second peak is employed, e.g., the antiferromagnetic coupling layer is preferably either made of Ru having a thickness of 0.4 nm or 0.8 nm, or is made of Jr having a thickness of 0.5 nm or 0.9 nm. However, it is also possible to employ the third peak or the fourth peak (or even other peaks), namely by providing even thicker antiferromagnetic coupling layers made of Ru or Jr, respectively. By using RKKY coupling, e.g., an RKKY antiferromagnetic coupling layer, an antiferromagnetic coupling with sufficient strength can be achieved, such that both parts of the storage layer will reverse together.

In a spintronic device comprising a second and third magnetic layer as described above, due to the antiferromagnetic alignment in the storage layer, a smaller net magnetic moment is obtained. Hence, the hybrid storage layer may be much less sensitive to stray fields induced by a fixed layer.

In embodiments of the first aspect, the spintronic device is further comprising an upper, fixed magnetic pinning layer arranged over said metal layer.

As used herein, the phrase "arranged over" can describe either a configuration in which one layer is formed directly on top of another layer, or a configuration in which there is one or more intervening layers present between one layer and another layer. For example, an upper pinning layer that is arranged over a metal layer can refer either to a configuration in which the upper pinning layer is provided directly on the metal layer, or to a configuration in which there is one or more layers provided between the metal layer and the upper pinning layer.

Having an upper, fixed magnetic pinning layer makes it possible to generate an extra torque to the hybrid free layer, thereby reducing the switching current needed while at the same time retain a high retention characteristic.

In embodiments of the first aspect of the invention, the tunnel barrier is provided on a lower, fixed magnetic pinning layer. Thus, the spintronic device may comprise a fixed layer on an opposite side of the tunnel barrier than the hybrid storage layer.

The upper fixed magnetic pinning layer and/or the lower, fixed magnetic pinning layer may be a hybrid layer, such as Co/Pt, Co/Pd, Co/Ni, or a combination or multilayers thereof. However, the upper fixed magnetic pinning layer may be also an alloy, such as CoPt, CoCrPt, FePt, FePd, or a combination thereof.

The upper magnetic pinning layer and/or the lower magnetic pinning layer may also be any state-of-the art pinning structure, such as a SAF pinning structure of the form [Co/Pt] x/Ru/[Co/Pt] y.

As an example, the lower and upper, fixed magnetic pinning layers may be configured to both apply torques to the hybrid storage layer.

The lower and upper, fixed magnetic pinning layers may for example be configured to apply opposite torque to the hybrid free layer.

As an example, if the at least one further magnetic layer of the hybrid free layer consists of a second magnetic layer, e.g., if the hybrid free layer consists of a first magnetic layer; a spacer layer provided on the first magnetic layer and a single further magnetic layer, then the magnetization of the upper and lower pinning layers are preferably of opposite direction such that they apply additive torque to the hybrid free layer.

However, if the at least one further magnetic layer of the hybrid free layer comprises a second magnetic layer, an antiferromagnetic coupling layer provided on the second magnetic layer, and a third magnetic layer that is antiferromagnetically coupled to the second magnetic layer, then the magnetization of the two pinning layers may be in the same direction since the hybrid free layer has different magnetic orientation at the bottom and top interfaces.

In embodiments of the first aspect, the spintronic device is further comprising an upper magnetic layer provided on said metal layer.

The upper magnetic layer may be any perpendicular magnetic layer. The upper magnetic layer may for example be a Co-based layer, such as Co, CoNi, CoPt, or CoFe layer, or a laminate or an alloy thereof. Furthermore, the upper magnetic layer may have a thickness of 0.2-2.5 nm, such as between 0.4-2.0 nm.

Furthermore, the upper magnetic layer may further be exchange coupled to an upper fixed, magnetic layer, thereby forming an upper, fixed magnetic pinning layer. Thus, the upper magnetic layer and upper fixed magnetic layer may form an upper fixed magnetic pinning layer as discussed herein above.

In embodiments of the first aspect, the tunnel barrier is an MgO based layer. The "MgO-based" tunnel barrier can be a MgO layer. However, it can generally be a layer based on MgO, for instance, a $MgGaO_x$ or $MgAlO_x$ layer. $O_x$ can e.g. be O, $O_2$, $O_3$, etc.

As an example, the spintronic device may comprise a single MgO-based layer. Thus, the present invention provides for removal of a second (top) MgO layer, while at the same time retain a high retention of the storage layer.

In embodiments of the first aspect, the device is a three terminal device or a two terminal device.

The spintronic device may thus comprise at least two, such as at least three terminals. In a two-terminal device, a first terminal may be connected to a lower pinning layer whereas a second terminal may be connected to an upper pinning layer. In three-terminal device, a first terminal may be connected to a lower pinning layer whereas a second and a third terminal may be connected to the top metal layer, such as to an upper pinning layer.

In embodiments of the first aspect, the spintronic device is a memory device, in particular is a spin torque transfer (STT) magnetic random access memory (MRAM) device, a spin-orbit torque (SOT) MRAM device, or a magnetic racetrack memory device.

In a preferred embodiment, the spintronic device is a magnetic random access memory (MRAM) device.

In embodiments of the first aspect, the spintronic device is a domain wall logic device, in particular, it is a spin torque majority gate (STMG) device.

In a second aspect of the disclosed technology, there is provided a method of manufacturing a spintronic device, the method comprising providing a tunnel barrier, providing a hybrid storage layer on the tunnel barrier, comprising providing a first magnetic layer on the tunnel barrier, providing a spacer layer on the first magnetic layer and providing at least one further magnetic layer on the spacer layer wherein the at least one further magnetic layer is exchange coupled to the first magnetic layer via the spacer layer, and wherein the method further comprises providing a metal layer on the hybrid storage layer.

This aspect may generally present the same or corresponding advantages as the former aspect. Effects and features of this second aspect are largely analogous to those described above in connection with the first and second aspects. Embodiments mentioned in relation to the first aspects are largely compatible with the second aspect.

In embodiments of the second aspect, at least one of the layers of the spintronic device is a polycrystalline fill.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

The embodiments of the spintronic device of the present disclosure rely on a synthetic antiferromagnet hybrid storage layer design. Thus, the spintronic device may be configured as either a bottom-pinned or a top-pinned spintronic device. For a top-pinned device, the storage layer is arranged at the bottom of the full device (e.g., MRAM) stack. For a bottom-pinned device, the storage layer is arranged at the top of the stack. The top-pinned device geometry is currently used/evaluated to realize spin logic devices, such as the STMG device.

Figure 1:
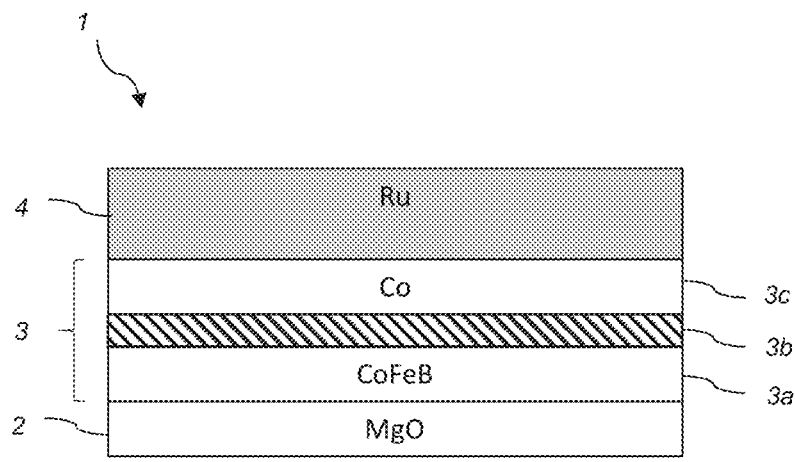
FIG. 1 is an illustration of a spintronic device according to an embodiment of the disclosed technology.

FIG. 1 shows a spintronic device according to an embodiment of the disclosed technology. The spintronic device may be a logic device or a memory device. In particular, the spintronic device 1 may be a STT-MRAM device, a SOT-MRAM device, a magnetic racetrack memory device, a domain wall logic device, or a STMG device.

The spintronic device comprises a tunnel barrier 2, a hybrid storage layer 3 provided on the tunnel barrier 2 and a metal layer 4 provided on the hybrid storage layer 3.

In this embodiment, the hybrid storage layer consists of a first magnetic layer 3a, a spacer layer 3b provided on the first magnetic layer 3a and a second magnetic layer 3c provided on the spacer layer 3b and exchange coupled to the first magnetic layer 3a via the spacer layer 3b. Thy hybrid storage layer thus comprises more than one type of magnetic material.

In this example, the tunnel barrier 2 is an MgO layer, thus forming an MgO interface to the first magnetic layer 3a.

The first magnetic layer 3a is in this example a CoFeB layer for providing the TMR effect for device read and a first spin transfer torque (STT) effect for device write. The thickness of the first magnetic layer is in the range is 0.4 to 1.4 nm.

In the illustrated embodiment, the second magnetic layer 3c is a Co layer which is exchange coupled to the first magnetic CoFeB layer 3a via the spacer 3b. The thickness of the second magnetic layer is e.g. between 0.4 to 1.5 nm.

Furthermore, the spacer layer 3b of the hybrid free layer 3 is a texture breaking layer for providing a texture breaking between the (100) oriented CoFeB and the (111) oriented Co layer. The spacer layer 3b is typically a heavy metal such as Ta, W, Mo or a heavy metal-transition metal alloy such as TaCoFeB, TaFe, TaCoFe, TaCo or WCoFeB.

The hybrid storage layers of the present disclosure thus provides for free layers in which one part is not made of CoFeb(001), but rather Co(111).

The metal layer 4 provided on the hybrid free layer 3 is in this sense a thick metal layer, such as Ru having a thickness of above 1 nm, such as 1-5 nm. As an alternative, the metal layer may comprise or consist of Ag, Au, Cu, Cr. As a further alternative, the metal layer 4 may be or comprise Pt, Pd or Ta. The metal layer 4 has further at least some lattice compatibility with the second magnetic layer 3c, such as with a Co(111) layer of 3c.

As illustrated in FIG. 1, the thick metal layer 4 is the final critical layer of the spintronic device 1. This layer alone can act has a spin sink, enabling more efficient switching than conventional stack designs. The advantage of the embodiment illustrated in FIG. 1 may be an easier offset field control, since no second magnet is present.

Figure 2:
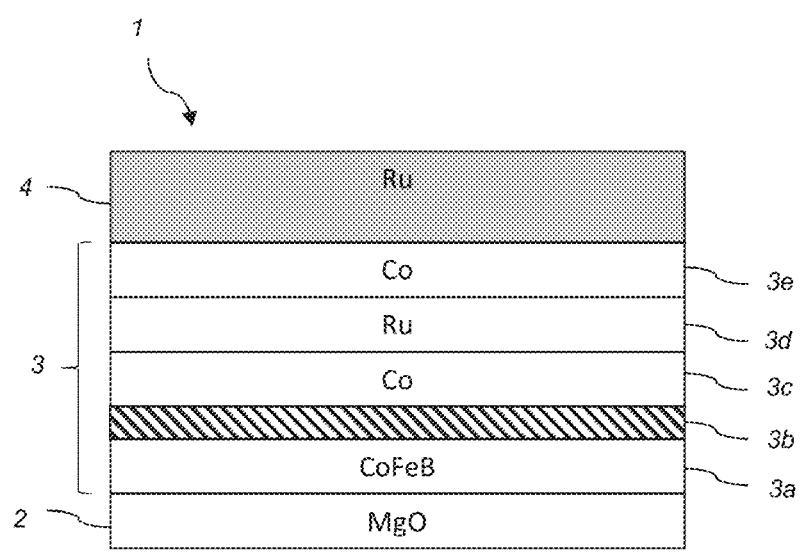
FIG. 2 is an illustration of a spintronic device according to an embodiment of the disclosed technology.

The spintronic device 1 illustrated in FIG. 2 is similar to the spintronic device illustrated in FIG. 1, but in this case the hybrid free layer 3 comprises further magnetic layers. There is a second magnetic layer 3c provided on the spacer 3b, and also an antiferromagnetic coupling layer 3d provided on the second magnetic layer 3c, and a third magnetic layer 3e that is antiferromagnetically coupled to the second magnetic layer 3c.

The first 3a and second 3c magnetic layers are as discussed in relation to FIG. 1 above. The antiferromagnetic coupling layer 3c is preferably Ru (0.4, 0.8), Ir (0.9), or Rh. The third magnetic layer 3e may also be a Co layer that is antiferromagnetically coupled to the second magnetic layer 3c, i.e. a Co layer that is antiferromagnetically coupled to a first Co layer in the stack.

Figure 3:
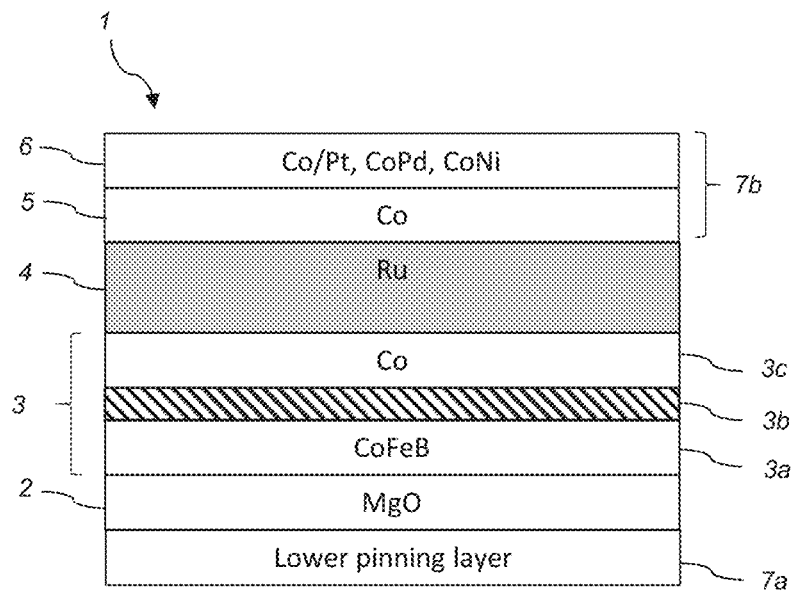
FIG. 3 is an illustration of a spintronic device according to an embodiment of the disclosed technology.

FIG. 3 shows an exemplary spintronic device 1 according to an embodiment of the invention, which builds on the spintronic device 1 shown in FIG. 1. In this embodiment, there is an upper magnetic layer 5 provided on top of the thick metal spacer 4. A typical thickness of the upper magnetic layer is in the range of 0.4 to 2.0 nm. This upper magnetic layer 5 is in this example a Co layer, which is further exchange coupled to a hard (fixed) magnetic layer 6. The upper magnetic layer 5 and the upper fixed layer 6 forms in this case an upper pinning layer 7b, which is configured to provide a torque to the hybrid free layer 3, via the metal layer 4.

The upper fixed magnetic layer 6 can for example comprise or consist of laminated Co/Pt, Co/Pd Co/Ni.

As also illustrated in FIG. 3, the MgO tunnel barrier 2 is provided on a lower pinning layer 7a. This pinning layer may be any pinning layer as known in the art and be configured to provide a torque to the hybrid free layer 3. Thus, with the upper pinning layer 7b, a second torque term, like in a double magnetic tunnel junction (MTJ) device, is provided, without the use of a second MgO layer in the layer stack.

Figure 4:
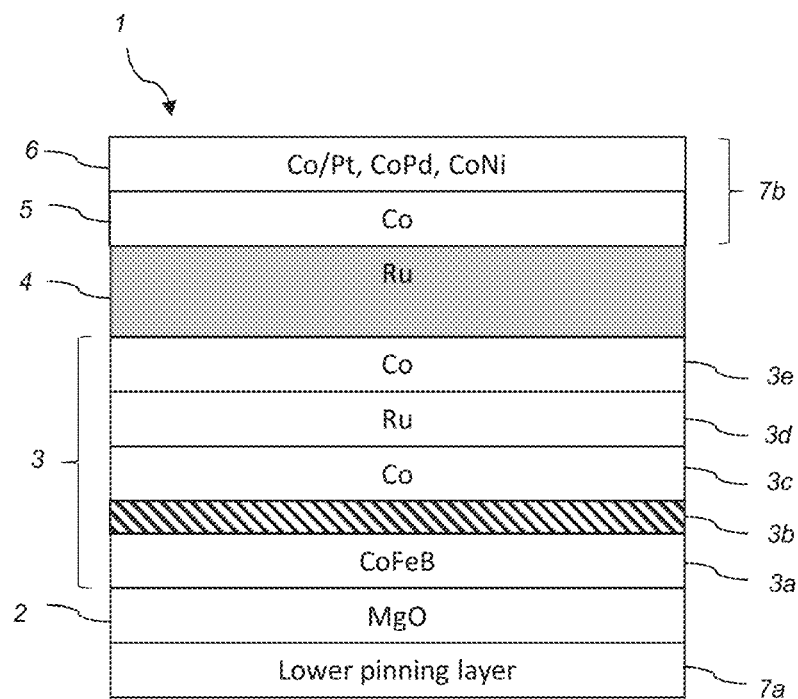
FIG. 4 is an illustration of a spintronic device according to an embodiment of the disclosed technology.

FIG. 4 shows an exemplary spintronic device 1 according to an embodiment of the disclosed technology, which builds on the spintronic device 1 shown in FIG. 2. In this embodiment, an upper pinning layer 7b, comprising an upper magnetic layer 5 and an upper, fixed magnetic layer 6 as discussed in relation to FIG. 3 above, is provided on top of the metal layer 4. Further, the MgO layer 2 is provided on a lower pinning layer 7a, and these pinning layers are thus configured to both provide torque to the hybrid free layer 3, as discussed in relation to FIG. 3.

There are several different upper 7b and lower 7a pinning layer configurations that may be used to apply torque to the hybrid free layer. A few examples are illustrated in FIG. 5a-d, in which the lower pinning layers 7a comprise a "reference layer 1" (RL1) provided on a lower "hard layer 1", whereas the upper pinning layers 7b comprise a "reference layer 2" (RL2) and an upper "hard layer 2" provided on the RL2.

Figure 5A:
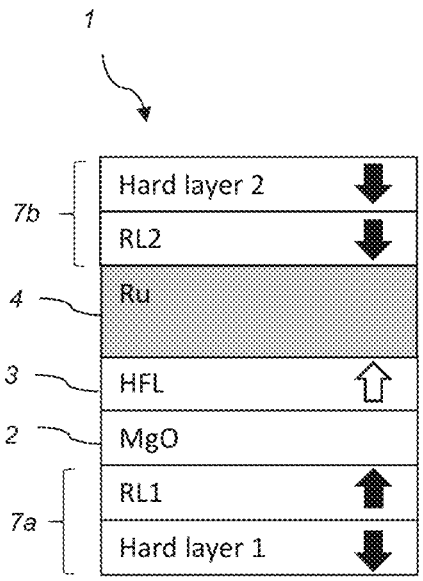
FIGS. 5a-d are illustrations of spintronic devices according to embodiments of the disclosed technology.
Figure 5B:
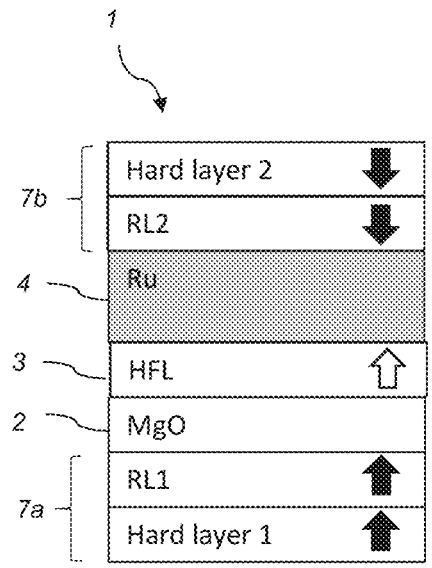
Figure 5C:
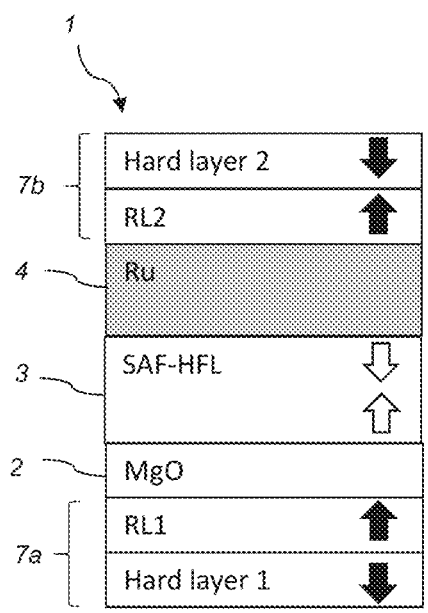
Figure 5D:
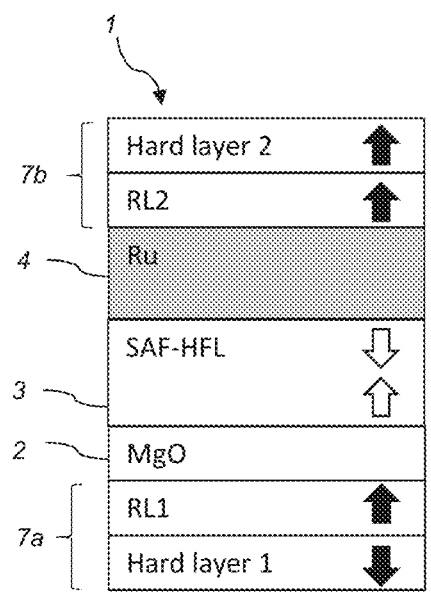

The lower pinning layer 7b may be in a synthetic antiferromagnet (SAF) configuration, in which the RL1 and hard layer 1 are two magnetic sublayers with opposite magnetizations, e.g. separated by a thin layer to provide a strong exchange coupling between the RL1 and hard layer 1, as illustrated in FIGS. 5a, 5c and 5d. However, the lower pinning layer may also be in synthetic ferromagnet configuration (SFM), in which the RL1 and hard layer 1 have parallel magnetizations, as illustrated in FIG. 5b. Also the upper pinning layers 7b could be in either SAF or SFM configurations, as illustrated in FIGS. 5a-d. The choice of the configuration may depend on the offset field that needs to be minimized at the hybrid free layer position.

Furthermore, a hybrid free layer 3 (HFL) as discussed in relation to FIGS. 1 and 3 may be used, or a hybrid free layer comprising second and third magnetic layers (SAF HFL) as discussed in relation to FIGS. 2 and 4 may be used.

However, it may be advantageous if the lower 7a and upper 7b pinning layers apply opposite torques to each other. This means that one of the RL may have a parallel alignment to the HFL 3, whereas the second RL may have an antiparallel alignment to the HFL 3, which is the condition to have additive torque. The different stacking illustrated in FIG. 5 is thus:

FIG. 5a: Lower pinning layer: SAF; upper pinning layer SFM; HFL free layer;

FIG. 5b: Lower pinning layer: SFM; upper pinning layer SFM; HFL free layer;

FIG. 5c: Lower pinning layer: SAF; upper pinning layer SAF; SAF-HFL free layer;

FIG. 5d: Lower pinning layer: SAF; upper pinning layer SFM; SAF-HFL free layer.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A spintronic device, comprising:
   a tunnel barrier;
   a hybrid storage layer on the tunnel barrier, wherein the hybrid storage layer comprises:
      a first magnetic layer,
      a spacer layer provided on the first magnetic layer, and
      at least one further magnetic layer on the spacer layer and exchange coupled to the first magnetic layer via the spacer layer, wherein the at least one further magnetic layer comprises a Co layer;
   a metal layer on the hybrid storage layer;
   an upper fixed magnetic pinning layer arranged over the metal layer; and
   a lower fixed magnetic pinning layer on which the tunnel barrier is formed, wherein each of the lower and upper fixed magnetic pinning layers comprises a reference layer and a hard layer, wherein each of the lower and upper magnetic pinning layers is configured to apply a spin torque to the hybrid storage layer, and wherein each of the reference and hard layers of the upper fixed magnetic pinning layer comprises Co.

2. The spintronic device according to claim 1, wherein the metal layer is configured to decouple the hybrid storage layer from the upper fixed magnetic pinning layer that is on top of the metal layer.

3. The spintronic device according to claim 1, wherein the metal layer has a thickness greater than 2 nm.

4. The spintronic device according to claim 1, wherein the metal layer comprises a metal selected from Ag, Au, Cu, Cr and Ru.

5. The spintronic device according to claim 4, wherein the metal layer comprises Ru.

6. The spintronic device according to claim 1, wherein the at least one further magnetic layer consists of the Co layer.

7. The spintronic device according to claim 1, wherein the at least one further magnetic layer comprises:
   a second magnetic layer;
   an antiferromagnetic coupling layer on the second magnetic layer; and
   a third magnetic layer that is antiferromagnetically coupled to the second magnetic layer, wherein the second magnetic layer or the third magnetic layer comprises the Co layer.

8. The spintronic device according to claim 1, wherein the reference layer of the upper fixed magnetic pinning layer comprises an upper magnetic layer on the metal layer.

9. The spintronic device according to claim 8, wherein both of an uppermost one of the at least one further magnetic layer and the upper magnetic layer comprise Co.

10. The spintronic device according to claim 9, wherein the uppermost one of the at least one further magnetic layer and the upper magnetic layer have the same composition.

11. The spintronic device according to claim 8, wherein the upper magnetic layer is exchange coupled to the hard layer of the upper fixed magnetic pinning layer.

12. The spintronic device according to claim 1, wherein the tunnel barrier is an MgO-based layer.

13. The spintronic device according to claim 12, wherein the spintronic device comprises a single MgO-based layer.

14. The spintronic device according to claim 1, wherein the spintronic device is a memory device configured as one of a spin torque transfer (STT) magnetic random access memory (MRAM) device a spin-orbit torque (SOT) MRAM device, or a magnetic racetrack memory device.

15. The spintronic device according to claim 1, wherein the spacer layer is a heavy metal layer or a heavy metal-transition metal alloy layer contacting the first magnetic layer and the at least one further magnetic layer.

16. The spintronic device according to claim 15, wherein the first magnetic layer is a CoFeB layer or a FeB layer, and wherein the at least one further magnetic layer further comprises a second magnetic layer selected from the group consisting of a CoNi layer, a CoPt layer, a CoFe layer, or a CoPtCr layer.

17. The spintronic device according to claim 16, wherein the first magnetic layer has one of (100) and (111) crystallographic orientations, and wherein the second magnetic layer has the other of the (100) and (111) crystallographic orientations.

18. The spintronic device according to claim 1, wherein the reference layer of the upper fixed magnetic pinning layer comprises a Co, CoNi, CoPt, or CoFe layer, laminate, or alloy thereof.

19. The spintronic device according to claim 1, wherein the hard layer of the upper fixed magnetic pinning layer comprises laminated Co/Pt, Co/Pd, or Co/Ni.

20. The spintronic device according to claim 1, wherein the reference and hard layers of the upper fixed magnetic pinning layer have parallel magnetizations and the reference and hard layers of the lower fixed magnetic pinning layer have opposite magnetizations.

21. The spintronic device according to claim 1, wherein the reference and hard layers of the upper fixed magnetic pinning layer have parallel magnetizations and the reference and hard layers of the lower fixed magnetic pinning layer have parallel magnetizations.

22. The spintronic device according to claim 1, wherein the reference and hard layers of the upper fixed magnetic pinning layer have opposite magnetizations and the reference and hard layers of the lower fixed magnetic pinning layer have opposite magnetizations.

23. A spintronic device, comprising:
   a tunnel barrier;
   a hybrid storage layer on the tunnel barrier, wherein the hybrid storage layer comprises:
      a first magnetic layer,
      a spacer layer provided on the first magnetic layer, and
      at least one further magnetic layer on the spacer layer and exchange coupled to the first magnetic layer via the spacer layer, wherein the at least one further magnetic layer comprises a Co layer;
   a metal layer on the hybrid storage layer; and
   an upper magnetic layer on the metal layer, wherein an uppermost one of the at least one further magnetic layer and the upper magnetic layer have the same composition.

24. The spintronic device according to claim 23, wherein both the uppermost one of the at least one further magnetic layer and the upper magnetic layer comprise Co.

* * * * *